United States Patent [19]

Humpherys

[11] Patent Number: 5,663,638
[45] Date of Patent: Sep. 2, 1997

[54] CALORIMETRIC RF POWER METER WITH DYNAMIC ZEROING AND CONSTANT TEMPERATURE AND POWER DISSIPATION IN THE CALORIMETRIC BRIDGE

[75] Inventor: Melvin D. Humpherys, Spokane, Wash.

[73] Assignee: Hewlett-Packard Company, Palo Alto, Calif.

[21] Appl. No.: 681,564

[22] Filed: Jul. 29, 1996

[51] Int. Cl.⁶ .......................... G01R 21/02; G01R 19/03
[52] U.S. Cl. ........................................... 324/95; 324/106
[58] Field of Search ................................. 324/95, 96, 105, 324/106; 455/61.1–67.1, 226.1–226.4, 115

[56] References Cited

U.S. PATENT DOCUMENTS

| | | | |
|---|---|---|---|
| 3,665,322 | 5/1972 | Julie | 324/106 |
| 3,845,388 | 10/1974 | Ley et al. | 324/106 |
| 3,928,800 | 12/1975 | Strenglein | 324/106 |

*Primary Examiner*—Ernest F. Karlsen
*Assistant Examiner*—Anh Phung
*Attorney, Agent, or Firm*—Edward L. Miller

[57] ABSTRACT

The effects of differential heating inside the calorimetric bridge are reduced by first heating the bridge externally and controlling the resulting temperature. The bridge is also heated internally by an amount that varies according to the applied power to be measured. This acts to eliminate the principal source of thermal gradients in the first instance. By applying this heat as a common mode input signal to the two terminating loads of the calorimetric bridge the bridge itself does not become unbalanced, and therefore does not attempt to measure that common power. Actual input power to be measured does initially unbalance the bridge, and is still measured as usual. A constant power circuit is response to the indication of measured power and acts to keep the sum of measured power (plus the equal amount of feedback power that balances the bridge) and the common mode power at a constant value corresponding to a full scale measurement. This eliminates internal thermal transients within the bridge that lengthen response time. The feedback signal to balance the calorimetric bridge is produced by an integrator. To allow operation of the integrator output closer to zero for measurement of small applied signals, the applied input to be measured is periodically removed and a suitable slight offset from the true balance condition is introduced into the servo loop. The bridge is then exactly balanced with a separate sample and hold control loop. "Periodically" can mean once a second, ten times a second, or as is preferred, at the start of each measurement.

6 Claims, 5 Drawing Sheets

FIG. 5C

CALORIMETRIC RF POWER METER WITH DYNAMIC ZEROING AND CONSTANT TEMPERATURE AND POWER DISSIPATION IN THE CALORIMETRIC BRIDGE

REFERENCE TO RELATED APPLICATION

The subject matter of this application is related to what is disclosed in U.S. Pat. application Ser. No. 08/548,067 entitled METHOD AND APPARATUS FOR MEASURING RF POWER IN A TEST SET, filed on 25 Oct. 1995 pending by Melvin D. Humpherys and assigned to Hewlett-Packard Co. U.S. patent application Ser. No. 08/548,067 is hereby expressly incorporated herein by reference.

BACKGROUND OF THE INVENTION

Developments in semiconductors in the last decade or so and recent changes in the allocation of portions of the radio frequency spectrum have contributed to the vigorous growth in the uses and markets for various portable transceivers, such as used in cellular telephone service and GMRS. That which is to be manufactured must also be tested and, as needed, repaired and tested. The advent of spread spectrum technologies, such as CDMA in the United States and GSM in Europe, require that additional levels of sophistication be included in the test equipment, to allow that aspect of the performance of the device under test to be evaluated. Such test equipment ought to be reliable and relatively compact (those wishing to sell systems comprising a rack full of separate instruments need not apply . . . ) as well as adaptable to future developments.

Among the things that such a test set has to do is measure RF power. The power measurement module of such a test set ought therefore to be small, accurate, broad band, suitable for pulse modulation applications in addition to CW, and, inexpensive. That is quite a list of disparate requirements, and poses a significant challenge to the designers of a test set to be used with radio equipment such as cellular telephones.

A calorimetric RF power meter is a device that accepts RF power into a terminating load, and thermally couples the heat generated to a temperature dependent resistance that is one arm of a bridge. This unbalances the bridge and produces an error signal within a servo loop. The servo responds by applying DC or low frequency power to a separate but identical terminating load whose heat is coupled to another arm of the temperature sensitive bridge. The applied power is measured by metering how much power is required of the servo loop to rebalance the bridge. Calorimetric RF power meters of this sort have been known for some time. See for example, the Operating and Service Manual for the Hewlett-Packard Model 434A Calorimetric Power Meter (circa 1961). A more recent example of this technique can be found in an article on page 26 of the July 1987 Hewlett-Packard Journal entitled "Microprocessor-Enhanced Performance in an Analog Power Meter".

The accuracy of calorimetric bridges is affected by temperature, and especially by temperature differentials occurring across the bridge. Even though the electrical value of the components within the bridge can be trimmed into balance, they still have temperature coefficients, and it is exceedingly difficult to control the thermal paths within the physical part. The result is that under a thermal gradient, such as the application of power to be measured, the bridge can become unbalanced owing to an unsymmetrical response of the bridge itself to the thermal gradient. In time, if steady state conditions are maintained, the gradient will level out and an accurate answer will be available. It would be desirable if this need for thermal time constant response time could be eliminated.

A control loop can use an amplifier or an integrator to form the feedback signal. In many situations where a small change is to be measured and a DC measurement technique is prone to unacceptable drift, it is advisable to shift to AC measurement techniques. In these cases a synchronous detector coupled to an integrator form an attractive combination for forming the actual feedback signal from the amplified error signal. If, as in the case of a calorimetric power measurement technique, the integrator output is used to produce heat, then either polarity of output from the integrator can cause a point of balance. However, one polarity has associated therewith the wrong logical sense of change as between the feedback signal and the error signal. If the system gets into that state the feedback is not longer negative, but becomes positive. As a result, it is generally necessary to anticipate a worst case of margins and then prevent the integrator output from getting within that close to zero, even when the bridge is actually balanced. As a complication to the logic of the servo loop, that brute force solution is indeed manageable, but it can nevertheless have the disadvantage of limiting the accuracy with which small signal levels can be measured. It would be desirable if this limit on dynamic range could be eliminated by allowing the integrator output to operate much closer to zero when the bridge is indeed balanced.

SUMMARY OF THE INVENTION

A solution to the problem of differential heating inside the calorimetric bridge is to first heat the bridge externally and control the resulting temperature. An actual insulated oven could be used if desired, although it may be sufficient to rely upon a heated thermal mass without insulation.

A second solution to the problem of differential heating is to heat the bridge internally by an amount that varies according to the applied power to be measured. This acts to eliminate the principal source of thermal gradients in the first instance. By applying this heat as a common mode input signal to the two terminating loads of the calorimetric bridge the bridge itself does not become unbalanced, and therefore does not attempt to measure that common power. Actual input power to be measured does initially unbalance the bridge, and is still measured as before. A constant power circuit is response to the indication of measured power and acts to keep the sum of measured power (plus the equal amount of feedback power that balances the bridge) and the common mode power at a constant value corresponding to a full scale measurement, or perhaps even a little more. This eliminates internal thermal transients within the bridge that lengthen response time.

A solution to the problem of being unable to operate the integrator output sufficiently close to zero is to periodically remove the applied input and introduce into the servo loop a suitable slight offset from the true balance condition, and then exactly balance the bridge with a separate sample and hold control loop. "Periodically" can mean once a second, ten times a second, or as is preferred, at the start of each measurement.

DESCRIPTION OF A PREFERRED EMBODIMENT

Figure 1:
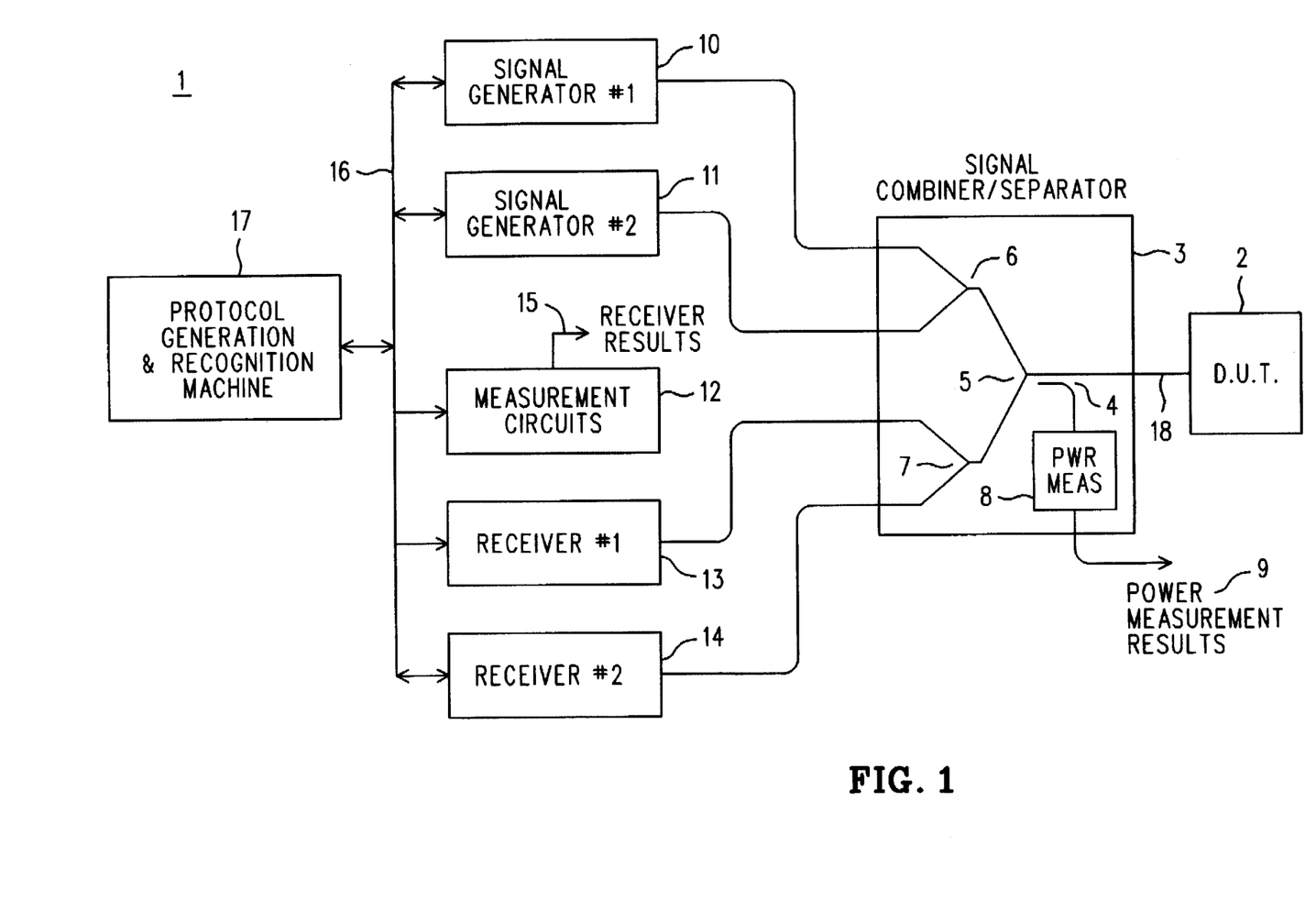
FIG. 1 is a simplified block diagram of a test set for radio communication equipment, such as cellular telephones and GMRS transceivers, and that includes an RF power measurement capability constructed and operating in accordance with the invention.

Refer now to FIG. 1, wherein is shown a simplified block diagram 1 of a test set for use with radio communication equipment, such as cellular telephones and GMRS transceivers. A DUT 2, or Device Under Test, represents the radio communication equipment to be tested. In this particular test set 1 there are two signal generators 10 and 11 and two receivers 13 and 14. Of the two receivers, receiver #1 13 is coupled to various measurement circuits that provide measured data called RECEIVER RESULTS 15. The operation of the receivers (13, 14) and signal generators (10, 11) is controlled by a protocol generation and recognition machine 17. This is principally an embedded microprocessor controlled system that interacts on the one hand with an operator through a display and control panel (not shown) or with external controller such as another computer system (not shown) to select or specify the type of measurement or test to be performed, and on the other hand with the internal resources of the test set (e.g., the signal generators 10 & 11 and receivers 13 & 14) to set up and perform those measurements and tests. An important task of the protocol generation and recognition machine 17 is the ability to take into account the specific properties and behaviors that make up the various standards by which the radio communication equipment is to operate, such as CDMA and GSM.

That said, it will be appreciated that a signal combiner/ separator 3 couples the DUT 2 to the various signal generators and receivers in the test set 1. Principally, the combiner/separator 3 functions as a specialized power splitter and power combiner to allow simultaneous access to the DUT 2 by the signal generators 10 and 11 and by the receivers 13 and 14. This action is represented schematically by individual components 5, 6 and 7. We shan't have much more to say about the elements 5, 6 and 7 in combiner/ separator 3, save that they must provide certain desirable isolation between various ones of the DUT and the signal generators and receivers, must not be lossy, and must be fairly broad band (say, flat from below 50 MHz to above 2 GHz). Our present interest is in the measurement of RF power present in the path 18 connecting the combiner/ splitter element 5 to the DUT 2.

To this end, note sampler 4, which may be a suitable directional coupler, which extracts a signal, say, 20 db below that present in line 18 and applies it to a power measurement module 8 whose output may be called POWER MEASURE- MENT RESULTS 9. POWER MEASUREMENT RESULTS 9 may be taken with RECEIVER RESULTS 15 as comprising the raw measurements of the performance of the DUT 2. These measurements are interpreted by the protocol generation and recognition machine 17.

Figure 2:
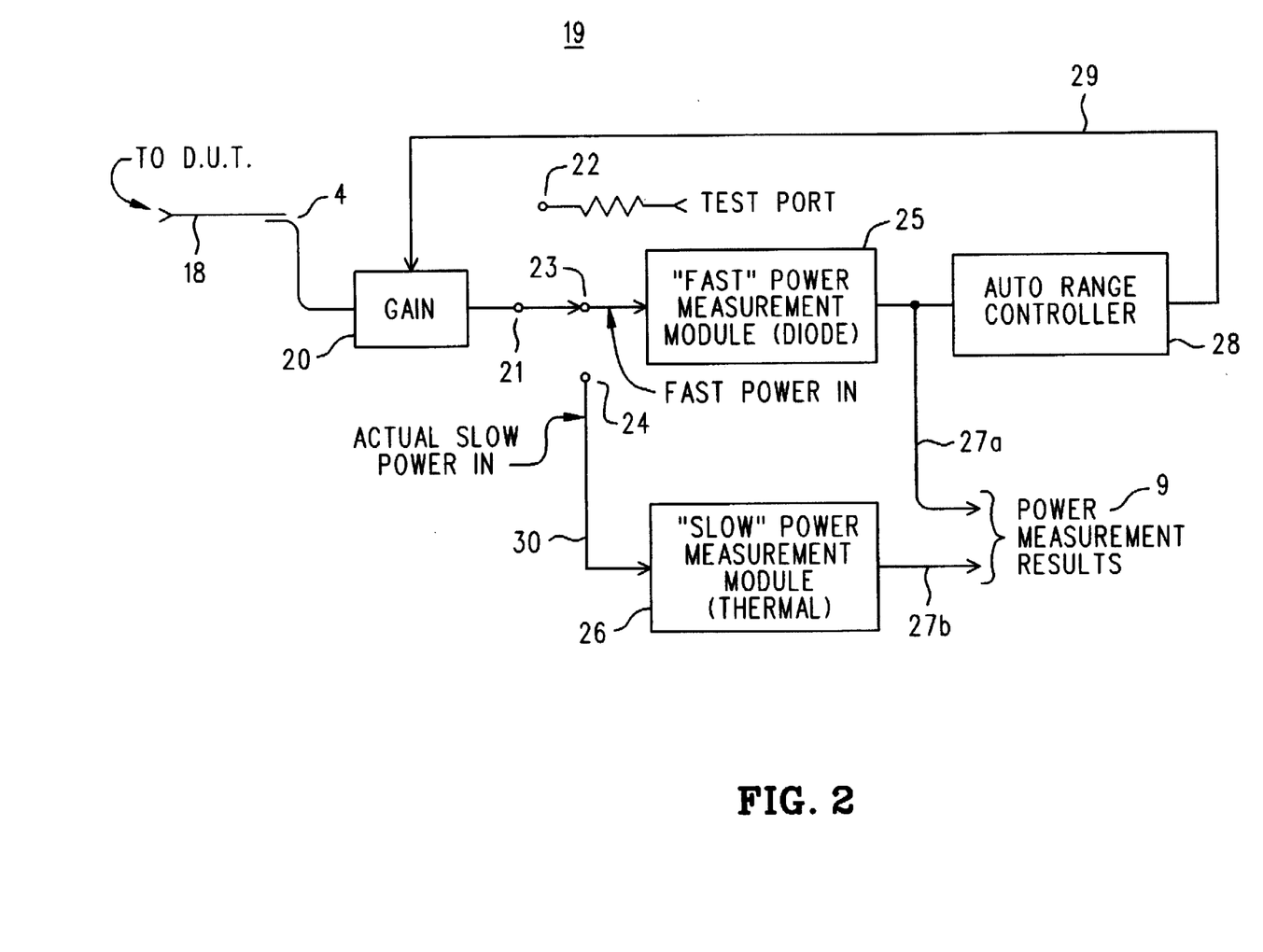
FIG. 2 is a an expanded yet still simplified block diagram of an RF power measurement portion of the test set FIG. 1.

Refer now to FIG. 2, wherein is shown in block diagram form 19 an expansion of the power measurement module 8.

RF power from the DUT 2 is coupled by line 18 and coupler 4 to a gain stage 20 whose gain may be set to a convenient amount, which includes zero. The signal from the gain stage 20 is applied to a switch 21. When the switch 21 is thrown to position 22 the output of the DUT is (via the gain stage 20) connected to a test port. This facilitates test and calibration of the test set itself. The switch 21 may also be set to position 23, which couples the DUT to a "fast" power measurement module 25 that uses a diode power sensor. The response time of the "fast" power measurement module 25 is in the microseconds and its output information 27a is made available as a part of POWER MEASUREMENT RESULTS 9, as well as being applied as an input to an auto range controller 28. The output of the auto range controller 28 is used to set the gain of the gain stage 20. The embedded control system periodically sets switch 21 to position 23 expressly so that the gain of gain stage 20 may be set to a value that places the output power level of the gain stage within the dynamic range of the "slow" power measurement module 26. It will be understood, of course, that the "fast" power measurement module 25 can also be used to perform primary power measurements on the DUT whenever a fast response is required; e.g., pulsed power measurements. Those interested in more information about what is in the fast power measurement module 25 may find it instructive to consult the aforementioned patent application Ser. No. 08/548,067.

To continue, we shall find it convenient to dwell on the arrangement that obtains when switch 21 is set to position 24. In such a case we shall say that the signal ACTUAL SLOW POWER 30 is coupled to the input of a "slow" power measurement module 26 whose power sensor is a calorimetric bridge. The output of the "slow" power measurement module 26 is information 27b that is part of the POWER MEASUREMENT RESULTS 9. Our interest is primarily in certain aspects of the operation and construction of the "slow" power measurement module 26.

Figure 3:
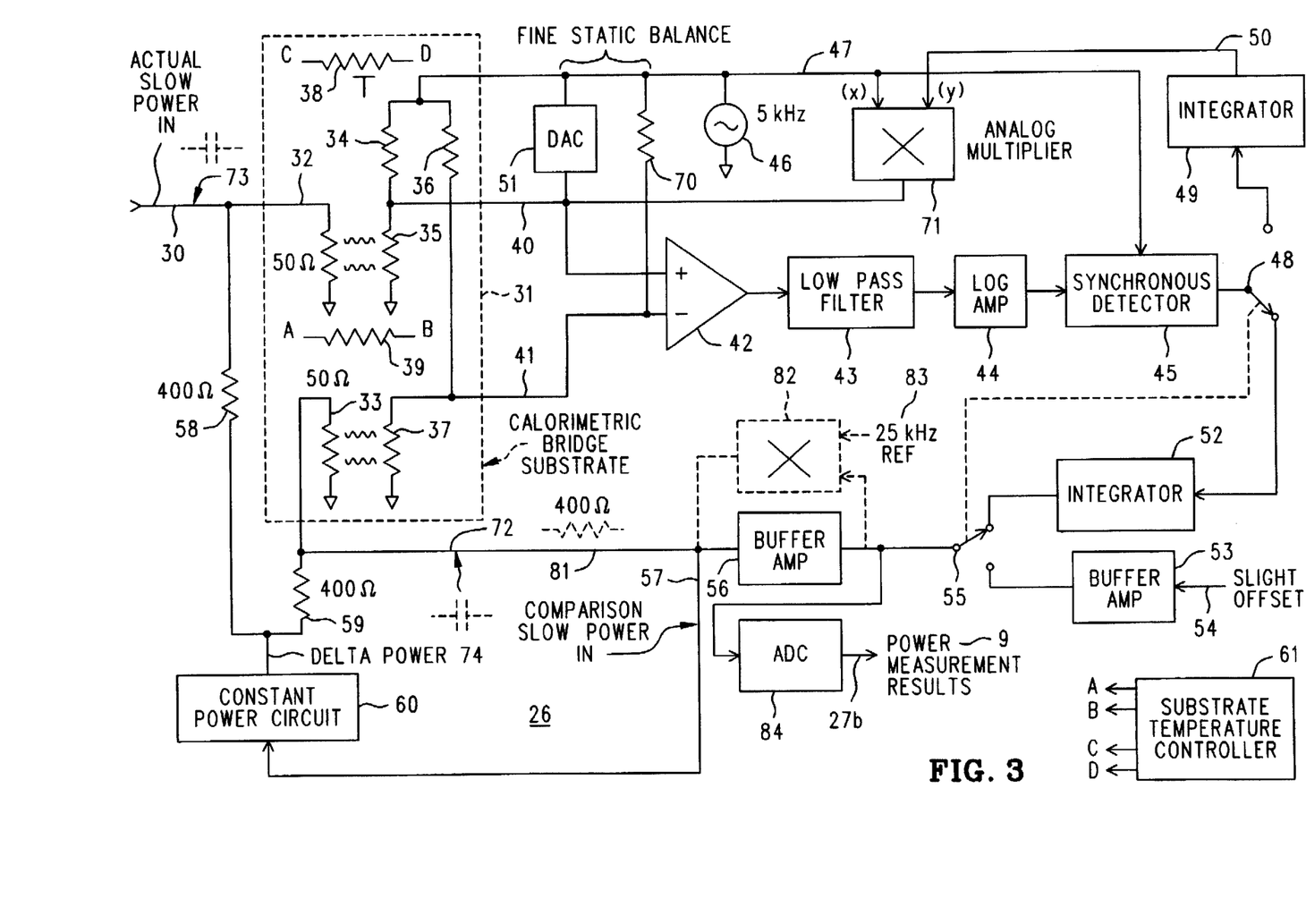
FIG. 3 is an expanded block diagram, for a portion of the block diagram of FIG. 2, representing a calorimetric RF power meter that includes dynamic zeroing and constant temperature and power dissipation in the calorimetric bridge.

Now consider the block diagram shown in FIG. 3. What is shown is a simplified block diagram of the "slow" power measurement module 26. At the upper left of the block diagram is the input signal ACTUAL SLOW POWER IN 30, while at the lower right appears the output signal 27b that is part of POWER MEASUREMENT RESULTS 9. We are interested now in what goes on inbetween these two signals.

The input signal ACTUAL SLOW POWER IN 30 is applied to a calorimetric bridge substrate 31 that includes a 50Ω terminating resistor 32 that is closely thermally coupled to a sensing resistor 35 whose resistive value has a significant dependence upon temperature. Sensing resistor 32 is in series with a load resistor 34, and forms a voltage divider therewith. A reference signal generator 46 produces a 5 KHz signal 47 that, among a number of other places, is applied to the top of the voltage divider formed by resistors 34 and 35. Thus, the amplitude of the 5 KHz signal 40 at the tap of the voltage divider is (principally) determined by the amount of power being dissipated in terminating resistor 32.

Now observe the signal COMPARISON SLOW POWER IN 57. It is a DC or low frequency signal applied to a 50Ω resistor 33 identical to resistor 32. Resistor 33 is closely thermally coupled to a sensing resistor 37 identical to sensing resistor 35. Resistor 37 is also in series with a load resistor 36 identical with load resistor 34, so that resistors 36 and 37 form a voltage divider corresponding to the voltage divider formed by resistors 34 and 35. The voltage divider formed by resistors 36 and 37 is also occupied at its top to the 5 KHz reference signal 47. Ideally, the amplitude of the signal 41 produced at the tap of this second voltage divider will equal that of the signal whenever power level of the signal COMPARISON SLOW POWER IN 57 is the same as that ACTUAL SLOW POWER IN 30. It is the job of the circuitry inbetween the two signal 30 and 57 to servo signal 57 to match signal 30 by nulling to zero the difference between signals 40 and 41. That done, the power level of signal 30 can be inferred by a direct measurement of the amplitude of signal 57, and the knowledge that resistor 33 is 50Ω. Along the way however, there arise some significant opportunities for error.

To continue, the calorimetric bridge substrate 31 is a unified assembly fabricated using thin film and integrated circuit techniques. The 50Ω resistors 32 and 33 are formed of meandering titanium traces, for example, and the entire assembly 31 is packaged up in its own little can. It is not, however, a part that was specifically designed for this particular application. It was designed to be an RF power sensor, to be sure, but for us happens to be an already existing part whose specifications and tolerances were selected to suit an earlier application. For reasons of economy, it is desirable to take advantage of this existing part, and find a way to live with certain "shortcomings" that result. (It is not that the part is a "bad" part; it is more that if we were designing it for the first time we would change some things to be more appropriate to our intended use. Even if we did, however, issues we are about to explore do not altogether vanish.)

So, let us first describe the overall servo loop that nulls the difference between signals 40 and 41 by adjusting the power level of signal 57. That done, we can return to a description of the "shortcomings" and what to do about them.

To begin, then, note that signals 40 and 41 are coupled to a difference amplifier 42 whose output is applied to a low pass filter 43. The main purposes of the low pass filter 43 are to assist in setting the dynamic behavior (step response) of the servo loop and to suppress harmonics of the amplified error signal. The output of the low pass filter 43 is coupled to a log amplifier 44, whose output is in turn applied to a synchronous detector 45. The synchronous detector 45 operates to rectify the amplified 5 KHz error signal; the resulting DC signal has a polarity indicative of whether COMPARISON SLOW POWER IN 57 is too high or too low, and is applied via switch 48 to either an integrator 49 during an instance of dynamic zeroing, or to an integrator 52 at other times. Integrator 52 responds to the continued presence of a rectified error signal by ramping its output up or down until the rectified error signal vanishes. During these "other times" (i.e., during power measurement) the output of the integrator 52 is coupled via switch 55 to a buffer amplifier 56, which may be a unity gain amplifier. It supplies the heft needed to drive the relatively low impedance of the 50Ω resistor 33. It will further be appreciated that buffer amplifier 56 might be replaced by an analog multiplier circuit 82 whose two inputs were the output of the integrator 52 via switch 55 and a low frequency AC signal 83 (say, 25 KHz). In this way the signal COMPARISON SLOW POWER IN 57 would become an AC signal instead of one that is DC. Once this main servo loop comes into balance, (which is perhaps on the order of several milliseconds) an ADC (analog to digital converter) 84 measures the amplitude of the integrator output signal (applied to the input of the buffer amplifier 56 or to the input of multiplier 82) to produce output 27b which is part of the POWER MEASUREMENT RESULTS 9.

We now consider certain improvements that make the thing work better. To begin with, it will be appreciated that a power measurement is really a difference measurement.

That is, what we really seek is the measured power when power is applied minus any residual "measured power" when power is not applied. Of course, the residual measured power does not represent real power, but drift or other imbalance in the system. One of these imbalances concerns the operating point of the main servo loop when there is indeed no power applied.

Let's assume for a moment that the system is truly ideal. Then, for zero RF in signals 40 and 41 are exactly equal, and the error signal all around the loop would be zero. In particular, the output of integrator 52 would be zero. Now, if there were just a slight amount of power applied to the ACTUAL SLOW POWER IN 30, the error signal from error amplifier 42 would be rectified and produce, say, a positive signal to apply to integrator 52. In turn, it would produce a positive going ramp that would eventually bring the loop back into balance. If the integrator overshot, or the actual input power level decreased, the synchronous detector 45 would reverse the sign of the rectified error signal, and the integrator would ramp back down. The sign of the integrator output would still be positive, however.

Now, in a real system there are always imbalances and offsets, however small. This means that the loop will come into balance with a slight integrator output. Absent the need to measure applied power, that quiescent state of slight integrator output could as easily be a slight negative output; after all, that would still produce power in resistor 33 that ought to balance the loop. Heat is heat. Ah, but what then of the logical sense of the control signal? If the loop overshoots the polarity of the signal from the synchronous detector 45 would still be negative, which would drive the output of the integrator 52 still more negative, further adding to the overshoot. In other words, the logical sense of the control signal has been reversed. The result is that the servo drives itself to the rail, and locks up. Clearly, this mode of operation must be avoided. As a practical matter, this means that actual operational "zero point" of the loop must not be set so close to the actual zero crossover of the integrator that noise, drift or other loss-of-margin conditions inadvertently pushes the servo system over the edge. Absent some better mechanism, the brute force accommodation for this situation is to simply put the operational zero point at what is really the ten percent point in the safe operating region. This works, but uses up dynamic range and make the measurement of low power levels less accurate.

Figure 4:
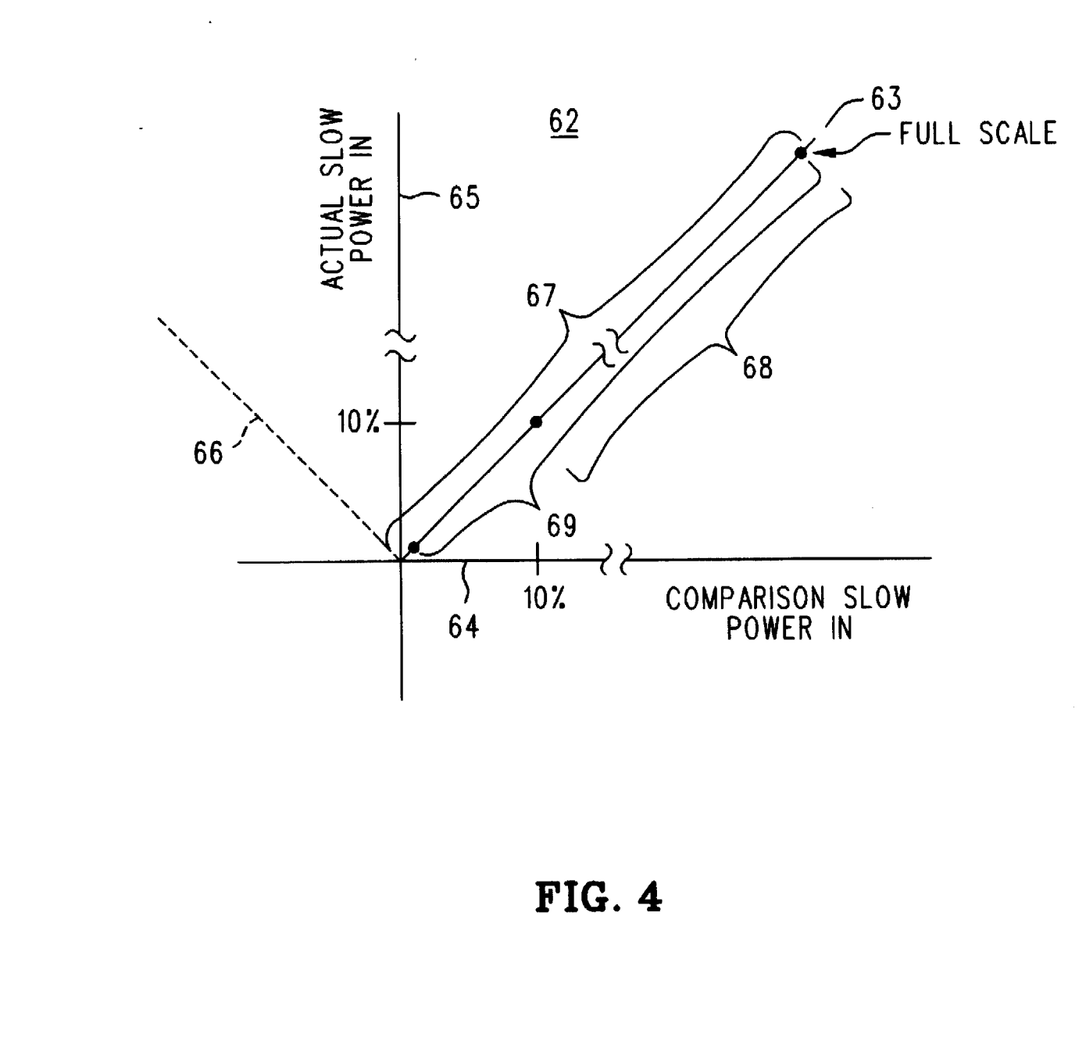
FIG. 4 is diagram indicating certain aspects of operation that are of interest for the calorimetric RF power meter of FIG. 3.

Reference to FIG. 4 will be useful at this point. FIG. 4 is a graph 62 of the COMPARISON SLOW POWER IN along abscissa 64 needed to null the servo loop for different mounts of ACTUAL SLOW POWER IN along ordinate 65. Because of the symmetry of the calorimetric bridge 31, the slope of the resulting line in the graph is one; ten milliwatts of comparison signal 57 balances ten milliwatts of input signal 30. Thus, line 63 is depicted as being at forty-five degrees to the axes. Range 67 would be the ideal range over which the loop would operate if there were no concerns about the output of the integrator 52 going negative. However, as we have seen, that is not a practical realization; dotted line 66 represents the unhealthy case. To keep the zero applied power condition from approaching the actual crossover point of the loop one might adopt operating range 68. This would be done by simply building into the loop sufficient offset to prevent the worst case pile-up of bad margins from producing an actual operating point that was too close the origin of the graph 62. One simply then scales the range 68 to represent the range of actual applied power. That is, the ten percent point at the lower end of range 68 represents no applied power, while the full scale point represents full scale applied power. As mentioned above, it is not that this does not work. It is more that it interferes with dynamic range and makes measurement of low power levels less accurate.

A better way would be to be able to safely adopt range 69 as the operating range; it's lower end is at, say, one percent. This is desired, even though we are either unable to, or choose to not, decrease the offsets and imbalances that combine to suggest the need for a ten percent margin in the first place. Simply put, we instead choose to operate the main loop fight next to the hairy edge, as it were, under the control of another control loop. With reference again to FIG. 3, here is how it is done.

First, we need a way to counter any imbalance in the calorimetric bridge 31 traceable to the two resistive dividers (34/35 and 36/37). The first tool for this is the ability to remove any input otherwise present on line 30, ACTUAL SLOW POWER IN. This is accomplished by setting the gain of gain stage 20 (see FIG. 2) to zero. The second tool for this is resistor 70 and DAC 51 (think: "programmable resistor"). Resistor 70 is small enough to, by itself, ensure that the loop gets unbalanced one way, no matter where in the allowable range of tolerances the voltage dividers end up. DAC 51 is then chosen to be able to move the loop back the other way by at least an amount equal to any worst Case imbalance in the first way. This is a long way of saying that it is guaranteed that some setting for DAC 51 will serve to balance the loop right at the true zero crossover, perhaps plus even a little more for safety. DAC 51 is initially set at say; the one percent mark. Note that DAC 51 is not an active part of the dynamic zero control loop promised above; it simply provides an initial operating point which may drift, but nevertheless "centers" the range of that dynamic zero control loop.

The control loop we seek dynamically sets the operational zero point of the main servo loop. To do this, switches 48 and 55 are periodically set (together) to the positions opposite the way they are shown in the figure. This connects the output of the synchronous detector 45 to the input of integrator 49 whose output 50 is applied as one input to an analog multiplier 71. The other input to the analog multiplier 71 is the 5 KHz reference signal 47. The output of the analog multiplier 71 may be thought of as a false error signal (as if from the voltage dividers in the bridge 31) that is coupled to the error amplifier 42. As before, the main servo system nulls itself, so that the output from the error amplifier goes to zero. Now, if there were no power going into bridge resistor 33 during this operation, this nulling would indeed tend to put the main loop right onto the exact loop crossover point: a very risky thing to do and almost certain to result in disaster. However, we do not let the power in bridge resistor 33 be zero! No Sir, we set it at the one percent mark by the action of switch 55 and the slight offset 54 applied to buffer amplifier 53. Thus it is that the dynamic zero servo loop of integrator 49 and analog multiplier 71 nulls to the one percent mark. Once this null has been achieved, switches 48 and 55 are set back to their normal positions. Integrator 49 simply holds its last output with very little drift until the next dynamic zero cycle.

A further enhancement in the performance of the calorimetric bridge 31 may be obtained by arranging that it operate at a constant temperature. To this end a substrate temperature controller 61 is provided, in conjunction with a heater resistor 39 and a sensing resistor 38. These two elements are not actually part of the bridge substrate 31, although they could be. It will be recalled that we used an existing part, and the keeper of the masks was cool to the idea of modifying the part. So, we located the sensing resistor close to the bridge sensor, put then both under a common canopy of thermal mass, and then surrounded all of that with a ring of heater resistors. All that stuff is mounted on a printed circuit board. This controls the temperature of the calorimetric bridge sensor (substrate) to about one degree Celsius. The whole works just described occupies about one half a square inch of board space, for perhaps a quarter of an inch high. Greater control of the temperature of the bridge sensor could be achieved if a genuine insulated oven were used.

Even then however, there would still be short term changes in the average temperature of the various elements within the bridge, owing to the application and removal of ACTUAL SLOW POWER IN 30 accompanied by the duplicate (done by the main servo loop) application and removal of COMPARISON SLOW POWER IN 57. These transient changes in operating temperature can reveal tracking errors in the temperature coefficients of the resistors making up the voltage dividers. How can we keep the bridge 31 warmed as if power were applied even when it isn't?

Suppose that no power is being applied via lines 30 and 57. Now apply duplicate amounts of power via resistors 58 and 59 to resistors 32 and 33, respectively. Let the amount applied be approximately the amount resistors 32 and 33 would experience under full scale measurement conditions. (An actual measurement initially unbalances the bridge, and so provokes a rebalancing via the error signal.) However, these conditions we speak of now are not measurement conditions! We are assuming that we apply the same power to each of resistors 32 and 33, so their heating does not unbalance the bridge; no error signal appears at error amplifier 42, and integrator 52 does not ramp. MEASUREMENT CONDITIONS DO PRODUCE AN INITIAL UNBALANCE OF THE BRIDGE; WHILE DRIVING RESISTORS 58 AND 59 DOES NOT. Resistors 58 and 59 are driven by a signal DELTA POWER 74 that is produced by a constant power circuit 60. The main servo loop cannot tell if constant power circuit 60 is driving resistors 58 and 59 or not, for its effect is common mode, and does not unbalance the calorimetric bridge 31. So, the main servo does its thing for applied power, regardless of whether or not the constant power circuit is present.

The constant power circuit 61 knows how much power (DELTA POWER 74) to apply to the bridge via resistors 58 and 59 because it monitors the same signal 57 that is metered to determine the POWER MEASUREMENT RESULTS 9. If zero power is being applied for measurement, then signal 57 is at its minimum (the dynamic zero loop keeps it close to, but safely away from zero, remember), then the constant power circuit 60 needs to produce exactly equal full power heating in each of resistors 32 and 33. If the input power to be measured were half of full scale, then the balance of full scale would be made up in the terminating resistors 32 and 33 by the constant power circuit 60. And if the input power to be measured were full scale, then no power would be supplied by the constant power circuit 60.

So, the constant power circuit 60 simply maps the minimum to maximum excursion of signal 57 into an appropriate excursion at the common end of resistors 58 and 59. The exact relationship of that mapping is determined by chosen resistance of 400Ω for resistors 58 and 59 in comparison to the values of 50Ω for resistors 32 and 33. The value of 400Ω for resistors 58 and 59 was selected to minimize the discontinuity caused by their presence.

Despite what was earlier said about the possibility that COMPARISON SLOW POWER IN 57 could be either an AC or a DC signal, it can now be appreciated that if the constant power circuit 60 is to be employed, it may be advantageous if COMPARISON SLOW POWER IN 57 is an AC signal. In this way it can be arranged that there be DC blocks at locations 72 and 73. In this way it is now certain that the DC power added by the constant power circuit will indeed be dissipated in the terminating resistor 33, regardless of the presence or absence of COMPARISON SLOW POWER IN 57. To the same end, it could be arranged that the power provided by the constant power circuit 60 be delivered as AC.

The particular way we have shown the constant power circuit 60 is one that is perhaps best suited for an analog circuit that operates on the analog value of COMPARISON SLOW POWER IN 57 to produce the drive DELTA POWER 74 to resistors 58 and 59. An alternate method of producing the drive to resistors 58 and 59 is to let the constant power circuit 60 include a DAC whose setting is obtained either from a calculation or a look-up table based on the digital value 27b (POWER MEASUREMENT RESULTS 9).

Figure 5A:
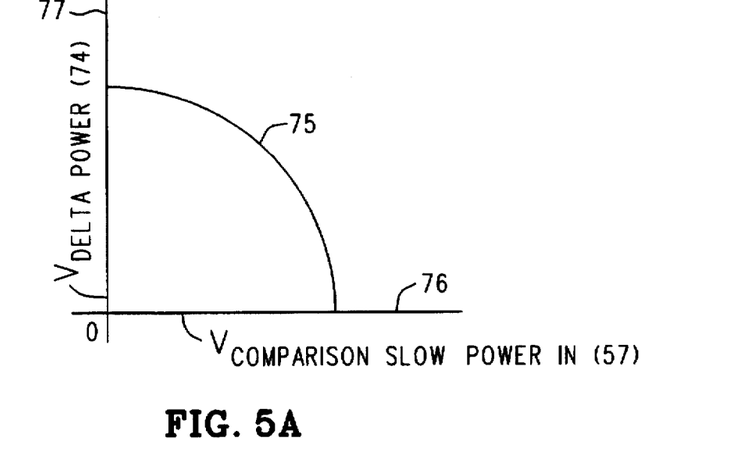
FIGS. 5A-C are diagrams describing a constant power circuit shown in the block diagram of FIG. 3.
Figure 5B:
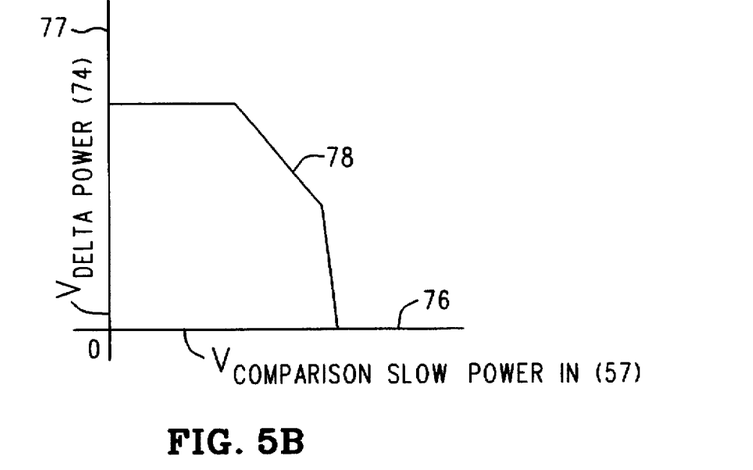
Figure 5C:
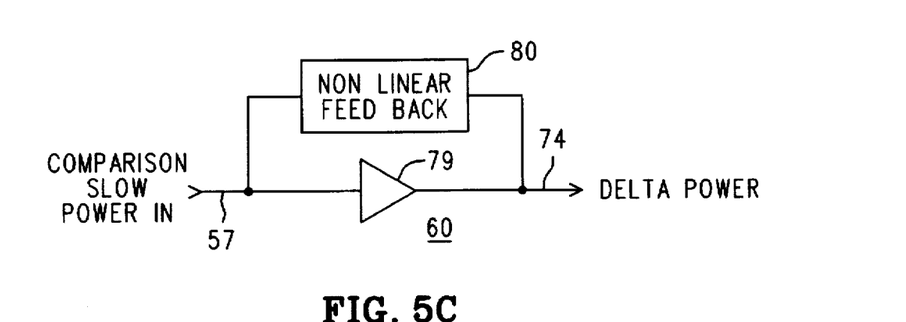

Certain aspects of one possible such constant power circuit 60 is shown in FIGS. 5A–C. The relationship we are interested in is $P_{app}+P_{comp}+\Delta P=C$. By this we mean that the applied power to be measured (30) and the resulting comparison power (57) produced to balance the calorimetric bridge, when added to delta power (74) sum to some constant amount, probably best taken to be twice full scale for $P_{app}$. We could also say that $2P_{comp}+\Delta P=C$. For the sake of brevity we omit the rigorous demonstration, merely reminding the reader to keep in mind that power is proportional to the square of the voltage and that overall amount of power that the constant power circuit 60 needs to produce must be divided among the isolation resistors 58 and 59 in order to get it to the terminating resistors 32 and 33.

For the sake of simplicity let us also temporarily assume that buffer amplifier 56 is absent and that in its place is multiplier 82 and 25 KHz reference signal 83. Now, the range of power levels that may be applied to either of the terminating resistors 32 and 33 is from −16 dbm to +8 dbm, or roughly from 25 mv to 500 mv for a 50Ω system. The analog multiplier 82 is much better suited to operating at a higher level (several volts). The solution is to attenuate the output of the analog multiplier 82, rather that try to operate it at levels where noise and nonlinearity are less favorable. Suppose we put a 400Ω resistor at location 81; this produces a 9:1 attenuation between the output of the analog multiplier 82 and what is produced across terminating resistor 33. (Note that it is now also necessary to adjust the interpretation of the output 27b of the ADC 84; it is now nine times too big.) Overall, this is good for the multiplier performance reasons stated above, but it also provides the simplicity (or removes a complication) that was alleged in the first sentence of the paragraph. The simplicity arises because now the circuits (82 or 56) that originate COMPARISON SLOW POWER IN 57 and the circuit 60 that originates DELTA POWER 74 all involve the same nine to one attenuation. Because of this symmetry our earlier statements about $P_{app}+P_{comp}+\Delta P=C$ and $2P_{comp}+\Delta P=C$ can be understood not only as applying to the 50Ω terminating resistors 32 and 33, but also to the series combination of those with an appropriate one of the 400Ω isolation/attenuation resistors.

With all these preliminaries safely understood, now consider the graph 75 in FIG. 5A. The abscissa 76 represents the voltage produced at the output of analog multiplier 82 (or, possibly at the output of buffer amplifier 56, so long as there is a 400Ω resistor at location 81). The ordinate 77 represents the corresponding voltage that is to be produced for DELTA POWER 74 by the constant power circuit 60. It can be shown, given the simplifications set out above, that the curve 75 is a quadrant of a circle.

Analog circuits that have (exactly) such a transfer function from input to output are, well, difficult. It turns out that in the present situation an approximation works quite satisfactorily. The approximation is shown in FIG. 5B as the graph 78. It is a piecewise linear approximation that can be obtained by those skilled in the art using any of a variety of shaped amplifier circuits similar to what is depicted in FIG. 5C. FIG. 5C shows the generalized form a shaped amplifier circuit that may be used as an analog instance of constant power circuit 60. As seen in the figure, the basic idea is to surround an amplifier 79 with a nonlinear feedback network 80. The nonlinear feedback network 80 may contain diodes, zeners, and perhaps other amplifiers. One of the reasons that such an approximation works quite well is that, at low power levels the exact graph 75 in FIG. 5A has the lowest dx/dy, and at high power levels has the greatest dx/dy. These extremes are perhaps the regions of greatest interest, and are fairly well represented by the approximation produced by the shaped amplifier circuit of FIG. 5C. If the constant power circuit 60 were implemented with a DAC (not shown) driven by a look-up table or computation based on signal 27b, then the approximation could be very near to perfect, indeed.

Now, what of those who desire that there be a value of resistance at location 81 that is different from that of the isolation resistors 58 and 59. Perhaps there is to be no resistance at all at that location. What then? Well, all that changes is that the graph 75 in FIG. 5A changes from being a quadrant of a circle to a quadrant of some ellipse. It is no more difficult to approximate that with either a circuit such as shown in FIG. 5C or with a DAC driven by a look-up table or computation based on signal 27b, than it is to do it for a quadrant of a circle.

It will be appreciated that the constant power circuit 60 enhances the operation of the dynamic zero mechanism (49, 50, 71). Why this is so may be understood by recalling that the dynamic zero mechanism first removes the applied input 30, and then does the zero. If there were a substantial level of power applied at the time of removal, then a significant amount of time would need to pass to allow the thermal transient to expire before an accurate zero could be set. Likewise, after the zero set operation the re-application of power would cause another thermal transient whose presence interferes with accurate readings. The constant power circuit 60 eliminates these transients, and allows the overall measurement system to dispense with thermal equilibration time associated with temporary imbalances introduced by legitimate changes in operating temperature. It does this by removing those changes in operating temperature.

Finally, if the constant power circuit is present, a further purpose for either buffer amplifier 56 or multiplier 82 will be appreciated. That further purpose is isolation. That is, they prevent any levels generated by the constant power circuit 60 from being measured by the ADC 84 and contributing (incorrectly, as it would be) to the signal 27b and POWER MEASUREMENT RESULTS 9.

I claim:

1. An RF power meter comprising:
a calorimetric bridge including an incident power port coupled to receive an RF work signal whose power level is to be measured, a comparison port coupled to receive a balancing signal, a bias input coupled to receive a bias signal, and first and second difference outputs at which appear respective first and second difference signals derived from the bias signal and whose amplitudes differ in proportion to the difference in power level between the work signal and the balancing signal;

a servo circuit coupled to the first and second difference signals and producing therefrom the balancing signal, the servo circuit adjusting the power level of the balancing signal to minimize the amplitude difference between the first and second difference signals;

a compensation circuit having an input coupled to the balancing signal and having a compensation output;

first and second isolation networks each coupled at one end to the compensation output and respectively at their other ends to the incident power port and the comparison port; and the compensation circuit applying equal amounts of additional power to the incident power port and to the comparison port, the compensation circuit adjusting these additional powers such that the sum of these additional powers, the power of the work signal and the power of balancing signal, is a constant.

2. An RF power meter as in claim 1 wherein the first and second isolation networks are resistors whose values of resistance are equal.

3. An RF power meter as in claim 1 wherein the compensation circuit comprises an analog shaping amplifier.

4. An RF power meter as in claim 1 further comprising an analog to digital converter coupled to the balancing signal to produce a digital power level signal and further wherein the compensation circuit comprises a look-up table addressed by the digital power level signal to produce a digital compensation value and also comprises a digital to analog converter having an input coupled to the digital compensation value and having an output coupled to the compensation output.

5. An RF power meter as in claim 1 further comprising:

a heater resistance thermally coupled to the calorimetric bridge;

a temperature sensor thermally coupled to the calorimetric bridge; and a temperature controller, coupled to the temperature sensor, that maintains the calorimetric bridge at a constant ambient temperature.

6. An RF power meter as in claim 1 wherein the servo circuit includes an integrator and the RF power meter further comprises:

a circuit, in series with the RF work signal before the RF work signal is applied to the incident power port, that at selected times reduces the power level of the RF work signal at the incident power port to substantially zero;

an offset circuit that during the selected times causes the servo circuit to produce for the balancing signal a selected fixed value corresponding to a minimally detectable non zero power level for the RF work signal; and a zero balance circuit coupled to an error signal within the servo circuit that during the selected times nulls to zero that error signal by varying the conduction in a shunt between the bias input and the first difference output and that during other times maintains the conduction in the shunt at its most recent value during a selected time.

* * * * *

UNITED STATES PATENT AND TRADEMARK OFFICE
CERTIFICATE OF CORRECTION

PATENT NO. : 5,663,638
DATED : September 2, 1997
INVENTOR(S) : Melvin D. Humpherys It is certified that error appears in the above-identified patent and that said Letters Patent is hereby corrected as shown below:

Column 2, line 16, "not" should read --no--; and
        line 46, "response" should read --responsive--.

Column 3, line 1, delete "a" after "is";
        line 8, insert --a-- after "Fig. 4";
        lines 29 and 30, between "with" and "external" insert --an--;
        line 58, "20db" should read --20dB--.

Column 4, line 31, "SLOWPOWER 30" should read --SLOW POWER IN 30--;
        line 65, "occupied" should read --coupled--.

Column 5, line 1, "signal" should read --signal 40--;
        line 3, "that ACTUAL" should read --that of ACTUAL--; and
        line 4, "signal 30" should read --signals 30--.

Column 7, line 11, "fight" should read --right--;
        line 25, "Case" should read --case--;
        line 29, "at say;" should read --at say,--; and
        line 48, "hulling" should read --nulling--.

Column 8, line 61, insert --a-- after "by".

UNITED STATES PATENT AND TRADEMARK OFFICE
CERTIFICATE OF CORRECTION

PATENT NO. : 5,663,638
DATED : September 2, 1997
INVENTOR(S) : Melvin D. Humpherys It is certified that error appears in the above-identified patent and that said Letters Patent is hereby corrected as shown below:

Column 9, line 36, "is" should read --are--;
        line 39, "-16dbm" should read -- -16dBm--; and
            "+8dbm" should read --+8dBm--.

Signed and Sealed this

Eighth Day of February, 2000

Attest:

Q. TODD DICKINSON

*Attesting Officer*      *Commissioner of Patents and Trademarks*